United States Patent
Tseng et al.

(10) Patent No.: US 7,652,378 B2
(45) Date of Patent: Jan. 26, 2010

(54) ALUMINUM-BASED INTERCONNECTION IN BOND PAD LAYER

(75) Inventors: Horng-Huei Tseng, HsinChu (TW); Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 87 days.

(21) Appl. No.: 11/582,129

(22) Filed: Oct. 17, 2006

(65) Prior Publication Data

US 2008/0185724 A1 Aug. 7, 2008

(51) Int. Cl.
*H01L 23/48* (2006.01)

(52) U.S. Cl. .................. 257/758; 257/784; 257/786; 257/E23.01; 438/612; 438/614; 438/618; 438/622

(58) Field of Classification Search .................. 257/758, 257/784, 786, E23.01; 438/612, 614, 618, 438/622

See application file for complete search history.

(56) References Cited

U.S. PATENT DOCUMENTS

| | | | |
|---|---|---|---|
| 5,785,236 A | 7/1998 | Cheung et al. | |
| 6,114,259 A * | 9/2000 | Sukharev et al. | 438/789 |
| 6,329,494 B1 | 12/2001 | Arai et al. | |
| 6,593,222 B2 * | 7/2003 | Smoak | 438/615 |
| 6,638,796 B2 | 10/2003 | Chuang | |
| 6,777,318 B2 | 8/2004 | Jeng et al. | |
| 6,825,541 B2 | 11/2004 | Huang et al. | |
| 6,831,349 B2 | 12/2004 | Chuang | |
| 2005/0067709 A1 * | 3/2005 | Bachman et al. | 257/763 |
| 2005/0104187 A1 | 5/2005 | Polsky et al. | |
| 2005/0200023 A1 | 9/2005 | Lin | |

* cited by examiner

*Primary Examiner*—Kiesha L. Rose
*Assistant Examiner*—Tucker Wright
(74) *Attorney, Agent, or Firm*—Slater & Matsil, L.L.P.

(57) ABSTRACT

A semiconductor metal structure with an efficient usage of the chip area is provided. The structure includes a substrate, a copper-based interconnection structure over the substrate, the copper-based interconnection structure comprising a plurality of metallization layers connected by vias and in first dielectric layers, at least one aluminum-based layer over and connected to the copper-based interconnection structure, wherein a top layer of the at least one aluminum-based layer comprises a bond pad and an interconnect line connecting to two underlying vias, vias/contacts connecting a top layer of the copper-based interconnection structure and a bottom layer of the at least one aluminum-based layer, wherein the vias/contacts are in a second dielectric layer, and a third dielectric layer overlying the at least one aluminum-based layer, wherein the bond pad is exposed through an opening in the third dielectric layer.

19 Claims, 5 Drawing Sheets

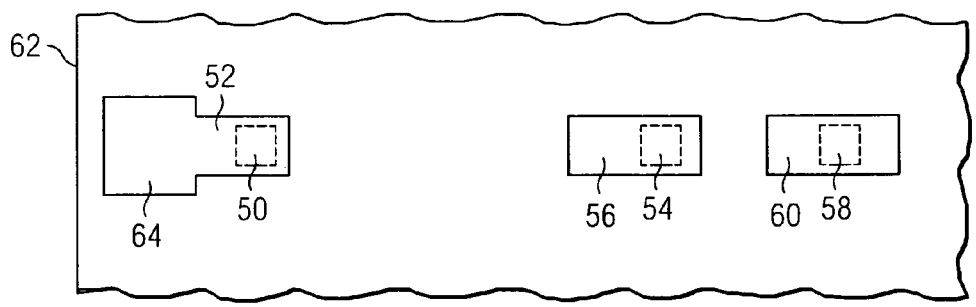
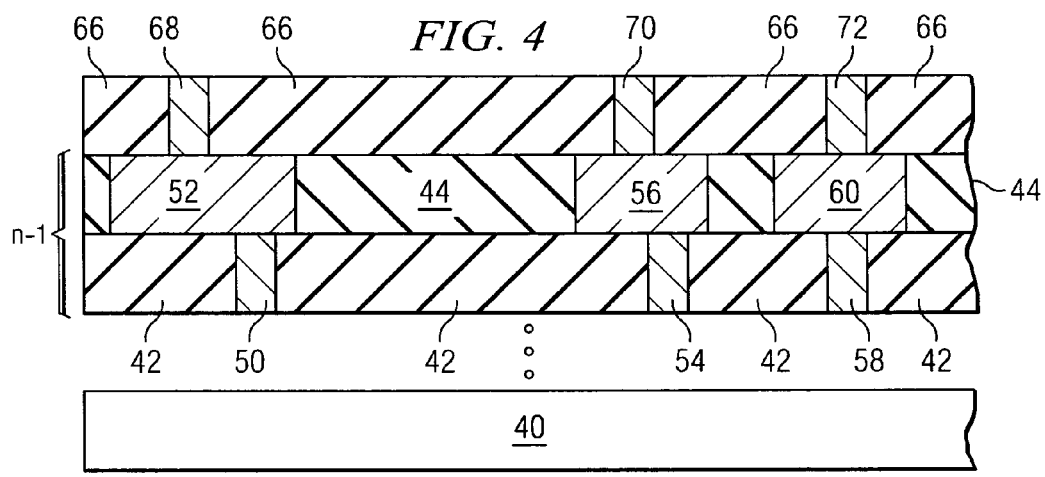
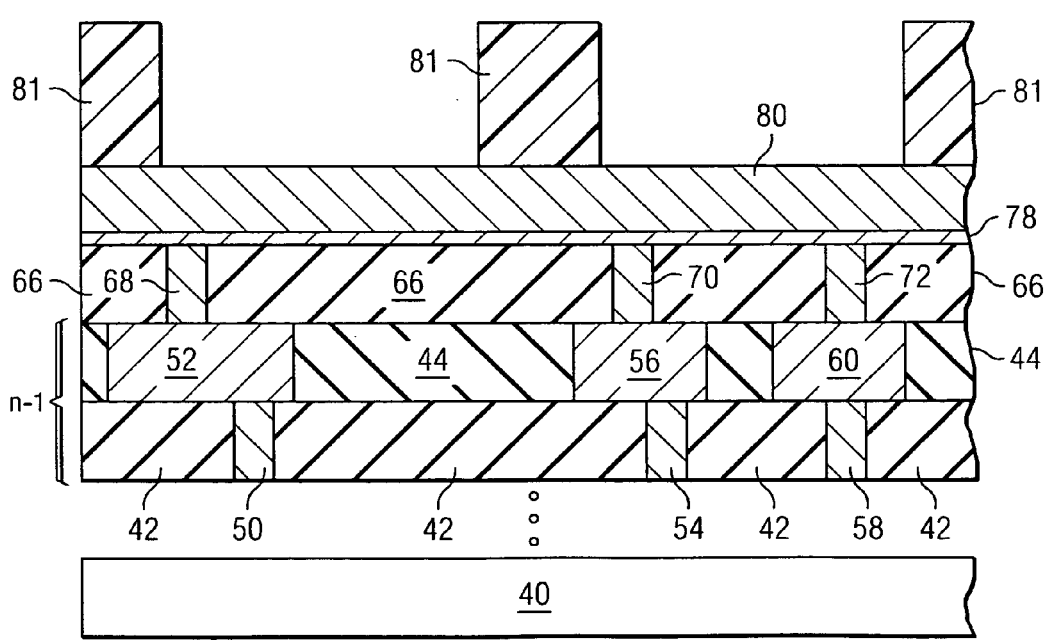

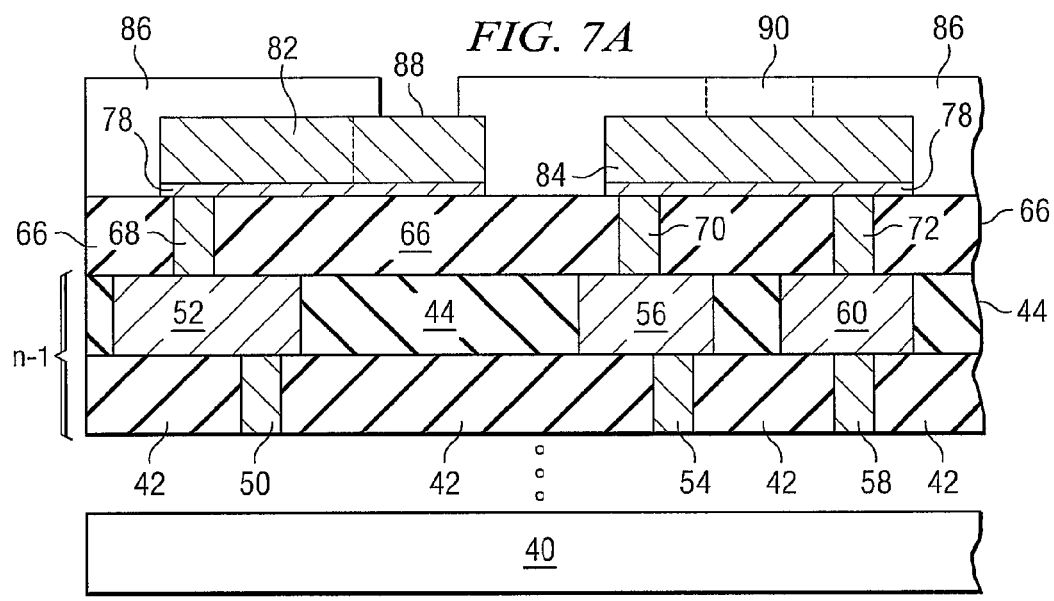
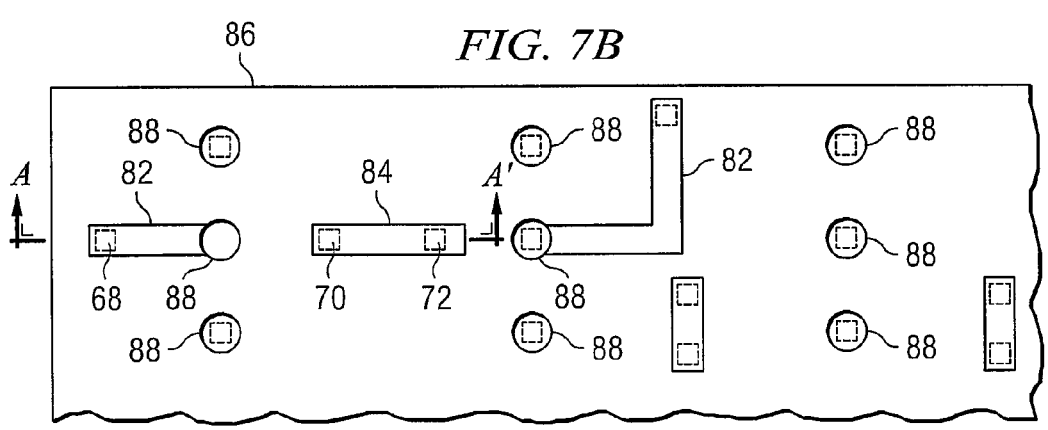

Modern integrated circuits are made up of literally millions of active devices such as transistors and capacitors. These devices are initially isolated from one another, but are later interconnected together to form functional circuits. Typical interconnection structures include lateral interconnections, such as metal lines (wirings), and vertical interconnections, such as vias and contacts. Interconnections are increasingly determining the limits of performance and the density of modern integrated circuits.

ALUMINUM-BASED INTERCONNECTION IN BOND PAD LAYER

TECHNICAL FIELD

This invention relates generally to the fabrication of integrated circuits, and more particularly to the formation of interconnection structures.

BACKGROUND

Modern integrated circuits are made up of literally millions of active devices such as transistors and capacitors. These devices are initially isolated from one another, but are later interconnected together to form functional circuits. Typical interconnection structures include lateral interconnections, such as metal lines (wirings), and vertical interconnections, such as vias and contacts. Interconnections are increasingly determining the limits of performance and the density of modern integrated circuits.

Typically, dielectrics having low dielectric constants are deposited by either CVD (chemical vapor deposition) or spin-on techniques, and low-resistance metals are patterned to form interconnects using damascene processes, which involve the patterning of trenches in a dielectric layer and the deposition of a metal to fill the trenches and form the metal interconnects. This process may require the overfilling of the trenches. A chemical mechanical polishing technique is then used to remove any excess metal outside the trenches.

On top of the interconnection structures, bond pads are formed and exposed on the surface of the respective chip. Electrical connections are made through bond pads to connect the chip to a package substrate. Bond pads can be used for wire bonding or flip-chip bonding.

FIG. 1 is a cross-sectional view of a conventional interconnection structure used in the semiconductor industry. On a substrate 110, which has integrated circuits (not shown) formed thereon, an interconnection structure 112 is formed. Interconnection structure 112 includes a plurality of metal lines, vias and/or contact plugs. Electrical connections are made through the interconnection structure 112 to a top metallization layer, in which bond pads are formed.

During the formation of the interconnection structure 112, some of the metal lines, which may be located in any metallization layer, may be used to test the devices formed on the substrate 110. For example, after a metallization layer n−1 is formed, a test is performed. In order to make electrical contacts to the metal lines, some of the metal lines, such as a metal line 114, are routed to the edges of the chip and are connected to test pads. Test pads are typically part of the respective metal lines, except the widths of the test pads are greater than the widths of the metal lines. After the test is finished, the formation process continues and the overlying vias and metallization layers are formed.

The top metallization layer is typically used for forming metal pads and redistribution lines. For flip-chip bonding, bond pads are distributed throughout the surface of the chip. Some of the metal lines, such as line 115, have already been routed to a central region of the chip and is extended to the edge of chip to form a test pad. A via thus can be formed directly connecting the overlying bond pad 120 and the test pad of metal line 115. Other metal lines, such as line 114, are close to the edge of the chip because they are used for test purposes. Therefore, metal line 114 and bond pad 116 are laterally spaced apart, and a redistribution line 118 is needed to redistribute connections from one location on the chip to another.

The top metallization layer is typically used for forming bond pads and corresponding redistribution lines. Compared to the lower level metallization layers, much fewer connections exist in the top metallization layer, and the usage of the chip area in the top metallization layer is low.

Therefore, there is a need for a novel design and/or fabrication method for increasing the usage of the top metallization layer.

SUMMARY OF THE INVENTION

In accordance with one aspect of the present invention, a semiconductor-metal structure includes a substrate, a copper-based interconnection structure over the substrate, the copper-based interconnection structure comprising a plurality of metallization layers connected by vias and in first dielectric layers, at least one aluminum-based layer over and connected to the copper-based interconnection structure wherein a top layer of the at least one aluminum-based layer comprises a bond pad and an interconnect line connecting to two underlying vias, vias/contacts connecting a top layer of the copper-based interconnection structure and a bottom layer of the at least one aluminum-based layer wherein the vias/contacts are in a second dielectric layer, and a third dielectric layer overlying the at least one aluminum-based layer, wherein the bond pad is exposed through an opening in the third dielectric layer.

In accordance with another aspect of the present invention, the semiconductor metal structure includes additional aluminum-based metallization layers over the copper-based metallization layers, wherein each aluminum-based metallization layer may include metal lines and interconnect lines.

In accordance with yet another aspect of the present invention, a semiconductor-metal structure includes a substrate, an interconnection structure formed over the substrate, the interconnection structure comprising a plurality of metallization layers connected by vias and in first dielectric layers, a metal-pad layer over the interconnection structure, wherein the metal-pad layer comprises a bond pad, an interconnect line and a redistribution line and wherein the interconnect line is not directly connected to a bond pad and is connected to at least two underlying vias/contacts, vias/contacts connecting a top layer of the interconnection structure and the metal-pad layer, wherein the vias/contacts are in a second dielectric layer, and wherein the first dielectric layers and the second dielectric layer have a thickness ratio of less than about 4. The semiconductor-metal structure further includes a passivation layer overlying the metal-pad layer, wherein the bond pad is exposed through an opening in the passivation layer.

With interconnect lines formed in the top metallization layer, one metallization layer and the respective process steps and masks may be saved. The overall mechanical strength of the respective chip is also improved.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2 through 7B are illustrations of intermediate stages in the manufacture of a preferred embodiment.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The intermediate stages of manufacturing a preferred embodiment of the present invention, which includes the formation of a bond pad and an interconnect line in a same metallurgy level, are illustrated. Throughout the description, when the term "interconnect line" is used to refer to a metal line in the top metal layer, it indicates that the metal line is connected to at least two underlying vias, so that an electrical connection between two underlying electrical features is made. Throughout the various views and illustrative embodiments of the present invention, like reference numbers are used to designate like elements.

Figure 1:
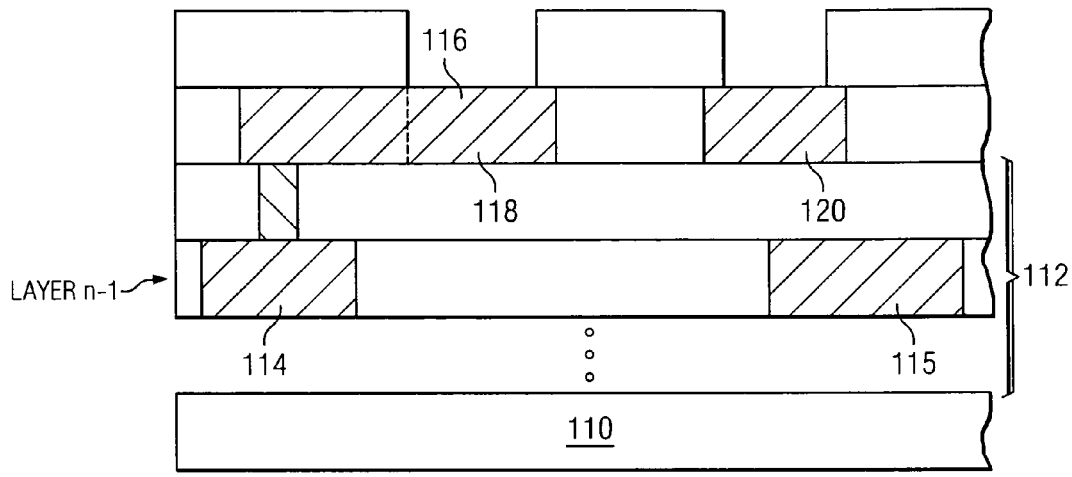
FIG. 1 illustrates a conventional semiconductor metal structure.
Figure 2:
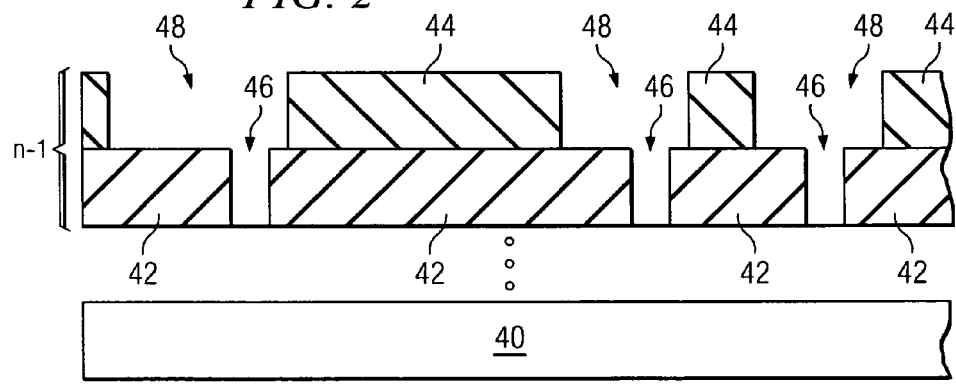

FIG. 2 illustrates a substrate 40, on which integrated circuits (not shown) are formed. In a typical formation process of an interconnection structure, an inter-layer dielectric (ILD, not shown) is formed over the substrate 40. Contact plugs (not shown) are formed through the ILD. Contact plugs are preferably formed by etching contact openings in the ILD and filling the openings with conductive materials, which preferably comprise tungsten, aluminum, copper, or other well-known alternatives. Contact plugs may have composite structures, including, e.g., barrier and adhesion layers.

A plurality of metallization layers are formed over the ILD to electrically connect and route lower layer metal lines to higher layer metal lines, as well as to interconnect devices and metal lines in lower-level metallization layers. Assuming there are n metallization layers including the layer for forming bond pads, and further assuming the top metallization layer is indicated as layer n, the formation of the metallization layer n−1, which is one layer under the top metallization layer, and the top metallization layer n, is discussed hereinafter to explain the concept of the present invention.

Starting from the ILD layer, metallization layers are formed one on top of the other. Dual damascene processes are preferably performed to form vias and metallization layers. The formation of metallization layer n−1 is shown in FIGS. 2 through 3B. FIG. 2 shows the formation of a via inter-metal dielectric (IMD) layer 42 over an underlying metallization layer n−2 (not shown), followed by the formation of a trench IMD layer 44 on the via IMD layer 42. Trench IMD layer 44 preferably has a low-k value, which is preferably less than about 3.2, while via IMD layer 42 may have k value greater than 3.2 or less than 3.2 depending on process integration and electrical performance. The preferred materials include carbon-doped silicon oxide. Trench IMD layer 44 and via IMD layer 42 preferably have thicknesses of less than about 2 μm, and more preferably less than about 15000 Å, and even more preferably between about 3000 Å and 15000 Å. One skilled in the art will realize that the thicknesses may be scaled with the forming technology. For example, if the k values of IMD 44 is greater than about 3.2, a ratio of the thickness of trench IMD layer 44 to the thickness of via IMD 42 may be less than about 1.5, while if the k values of IMD 44 is less than about 3.2, the ratio is preferably less than about 4. The methods of forming via IMD layer 42 and trench IMD layer 44 are known in the art, thus the details are not repeated herein.

In the preferred embodiment, dielectric layers 42 and 44 have different etching characteristics, thus an underlying layer may be used as an etch stop/buffer layer when an overlying layer is etched. In alternative embodiments, an etch stop/buffer layer (not shown) may be formed between the neighboring IMD layers 42 and 44, and/or underlying the via IMD layer 42. In yet other embodiments, a single dielectric material is formed and acts as a major portion of both the via IMD layer 42 and the overlying trench IMD layer 44.

Via openings 46 and trench openings 48 are then formed, preferably by etching via IMD layer 42 and trench IMD layer 46, respectively. In the preferred embodiment, via IMD layer 42 is used as an etch stop/buffer layer for etching trench openings 48. In alternative embodiments wherein the major portions of the via IMD layer 42 and trench IMD layer 44 are combined as a single layer, the depth of the trench openings 48 is controlled by adjusting the respective etching time.

Figure 3A:
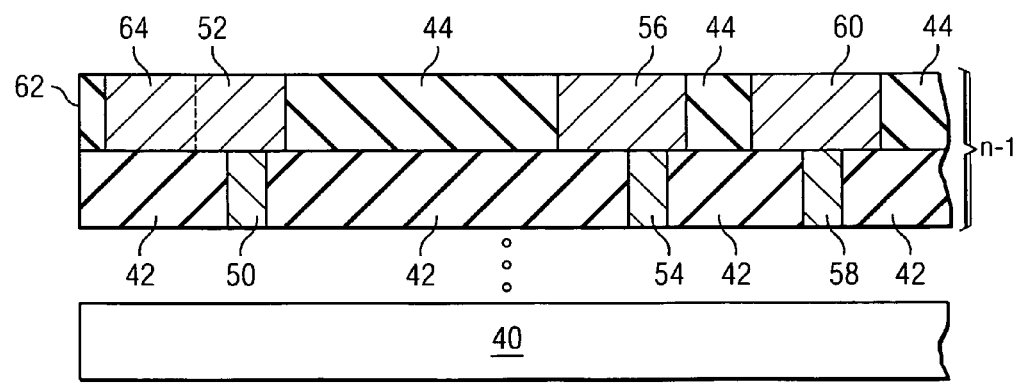

FIG. 3A illustrates the formation of metal lines and the underlying vias. A barrier layer (not shown), which preferably comprises titanium, titanium nitride, tantalum, or tantalum nitride, ruthenium-containing conductors, cobalt-containing conductors, wolfram-containing conductors, or combinations thereof, is formed in openings 46 and 48 (refer to FIG. 2). The barrier layer prevents copper from diffusing into the neighboring IMD layers. The remaining space of the via openings 46 and trench openings 48 are filled with conductive materials, preferably copper or copper alloys. A chemical mechanical polish (CMP) is performed to remove excess material, leaving metal lines 52, 56 and 60 and vias 50, 54 and 58.

It should be appreciated that although dual damascene processes are preferred for forming metallization layers and vias, single damascene processes, or the combination of dual damascene processes and single damascene processes, can also be used.

The metal line 52 preferably extends close to an edge 62 of the respective chip. An end portion of the metal line 52 is preferably expanded with a greater width, forming a test pad 64 having a pad size, for example, no greater than about 100 μm*100 μm, and more preferably no greater than about 70 μm*70 μm, such that a metal line (not shown) in an underlying metallization layer may route under the wider test pad for electromagnetic interference (EMI) shielding or metal routing efficiency in circuit design. It is appreciated that test pads may also be formed in metallization layer n−2 (not shown), which is a metallization layer under metallization layer n−1, and any underlying metallization layers. Metal lines 56 and 60 may be at other locations of the chip. FIG. 3B illustrates a top view of the structure shown in FIG. 3A.

FIG. 4 illustrates the formation of vias/contacts 68, 70 and 72. In a preferred embodiment, vias/contacts 68, 70 and 72 are copper-based vias formed by a single damascene process, which starts with the formation of a dielectric layer 66. Dielectric layer 66 preferably has a thickness of less than about 20000 Å, and more preferably less than about 15000 Å, and even more preferably between about 1000 Å and about 15000 Å.

The dielectric layer 66 may have a low-k value, for example, less than about 3.2. However, since fewer metal lines are formed in upper-level metallization layers, the distances between the metal lines and vias in the upper metallization layers are greater than the distances in the lower-level metallization layers, hence the parasitic capacitances between metal features are lower. Therefore, the k value of the dielectric layer 66 may be higher than the underlying dielectric layers for the benefit of improved mechanical strength. In an exemplary embodiment, the k value of the dielectric layer 66 is greater than about 3.2. The preferred material of the dielectric layer 66 includes un-doped silicate glass, fluorine-doped silicon oxide, carbon-doped glass, and the like. A ratio of the total thickness of dielectric layer for via/contact portion 66 to the thickness of trench IMD layers 44 is preferably less than about 8, and more preferably less than about 1.5, and even more preferably less than about 1.

Openings are then formed in the dielectric layer 66, followed by the formation of a diffusion barrier layer (not shown). Vias/contacts 68, 70 and 72 are then formed in the openings. The vias/contacts 68, 70 and 72 preferably comprise copper, aluminum, tungsten, gold, and the like.

In other preferred embodiments, the vias/contacts 68, 70 and 72 are contacts comprising tungsten, aluminum, and combinations thereof. As is known in the art, the structure shown in FIG. 4 may be formed by depositing a metal layer, etching the metal layer to form vias/contacts 68, 70 and 72, and forming the dielectric layer 66.

FIG. 5 illustrates the formation of a barrier layer 78, a metal-pad layer 80 and a photoresist 81, which is then patterned. The barrier layer 78 preferably comprises metals having low diffusibility, such as tantalum, tantalum nitride, titanium, titanium nitride, ruthenium-containing conductor, cobalt-containing conductor, wolfram-containing conductor, and the like. The metal-pad layer 80 is preferably an aluminum-based metal layer. In the preferred embodiment, the metal-pad layer 80 comprises AlCu, and may be formed using sputtering, physical vapor deposition (PVD), chemical vapor deposition (CVD), electrochemical copper plating (ECP), and the like. In alternative embodiments, the metal-pad layer 80 comprises aluminum, copper, gold, tungsten, or other commonly used metals and metal alloys. The thickness of the metal-pad layer 80 is preferably greater than about 3000 Å. One skilled in the art will realize that the optimum thickness (and the width of metal lines formed by patterning the metal-pad layer 80) are determined based on the current-carrying ability. Preferably, the sheet resistance of the metal-pad layer 80 is substantially close to the sheet resistance of the underlying metallization layer n−1.

Figure 6A:
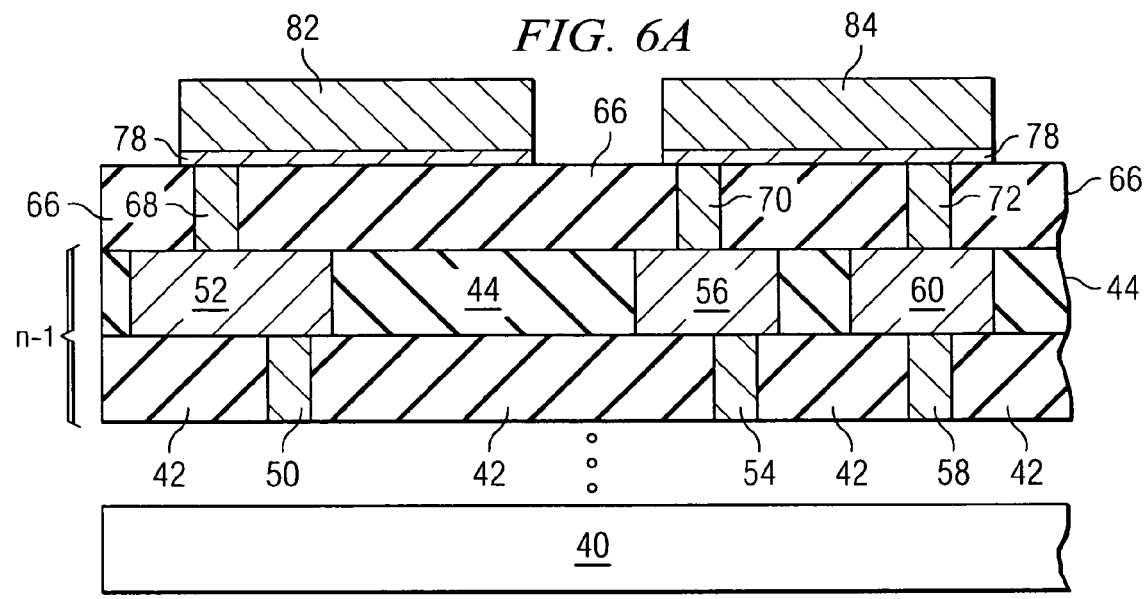

The stacked layers 78 and 80 are then etched, and a resulting structure is shown in FIG. 6A. The preferred etching methods include dry etching such as reactive ion etching (RIE) and ion beam bombardment. The remaining portions of the metal-pad layer 80 form a redistribution line 82 and an interconnect line 84, which connects two vias/contacts 70 and 72.

Figure 6B:
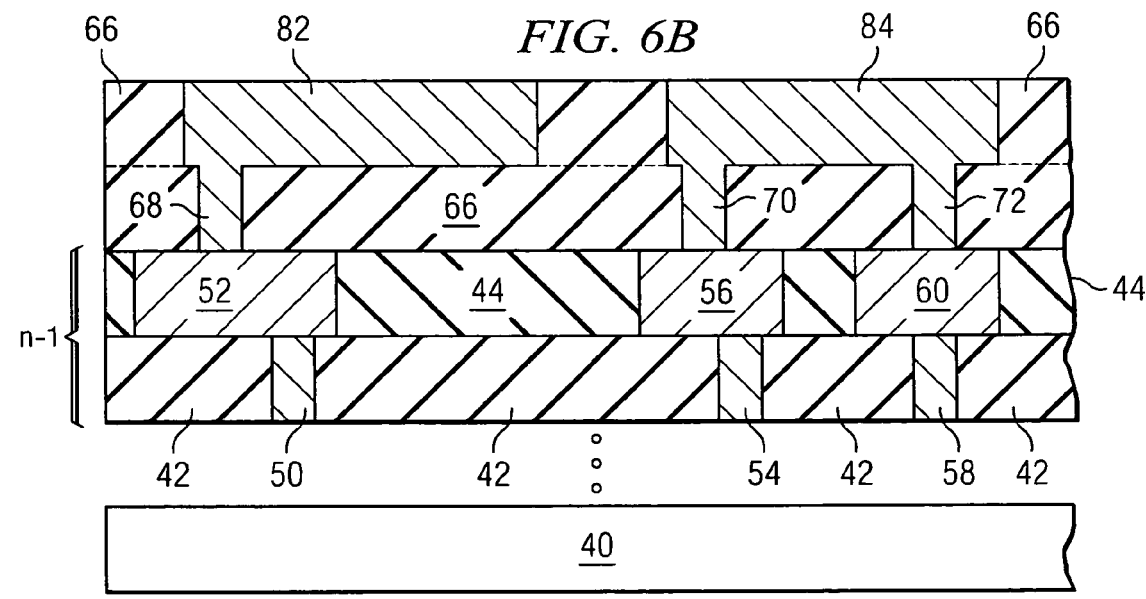

Alternatively, vias 68, 70 and 72 and redistribution line 82, as well as interconnect line 84, may be formed using a damascene process. Wherein features 68, 70, 72, 82 and 84 preferably comprise wolfram, aluminum-based conductor, copper, and combination thereof. The resulting structure is shown in FIG. 6B.

FIG. 7A illustrates the formation of a passivation layer 86, which is used for preventing moisture penetration and foreign ion contamination. The passivation layer 86 preferably comprises materials such as silicon oxide, silicon oxynitride (SiON), polyimide, silicon nitride (SiN), silicon oxycarbide (SiOC), and the like. The passivation layer 86 may also have a composite structure including more than one layer, each formed of a dielectric material. An opening is formed in the passivation layer 86 to expose a portion of the redistribution line 82 and to form a bond pad 88. Bond pad 88 may be a pad solely for bonding purpose, or a dual-zone pad including a first zone and a second zone, in which the first zone is for circuit probing and the second zone is for wire-bonding or solder bump attachment.

Since the interconnect line 84 is used for interconnecting vias 70 and 72 only, it is preferably completely covered by the passivation layer 86. However, if desired, a portion 90 of the passivation layer 86 may be removed to expose the underlying interconnect line 84 and to form a bond pad.

A top view of FIG. 7A is shown in FIG. 7B, wherein the cross-sectional view in FIG. 8A is taken from a plane crossing a line A-A' in FIG. 7B. Bond pads 88, which are symbolized by circles, are arranged in columns and rows. It can be found that some of the bond pads 88 are directly connected to the underlying vias, which are shown as squares, while other bond pads 88 are connected to the underlying vias through redistribution lines 82.

Figure 8:
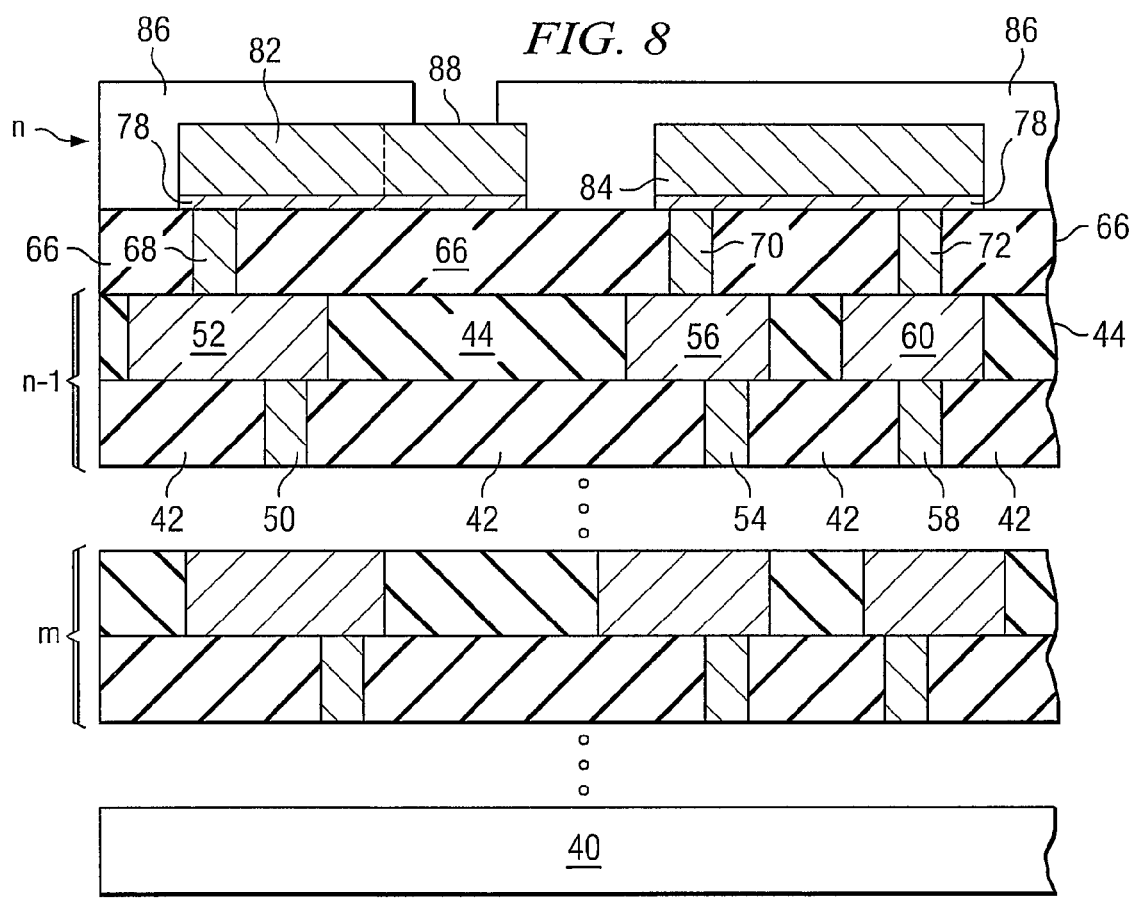
FIG. 8 illustrates a variation of the preferred embodiment comprising more than one aluminum-based metallization layers.

A further embodiment of the present invention is shown in FIG. 8. In this embodiment, metallization layers m through n, wherein m is smaller than n, are all formed with aluminum or aluminum alloys. These layers may be formed layer by layer by forming an aluminum-containing layer, etching the aluminum-containing layer to form desired conductive features, and filling vacancies between the conductive features with a dielectric material. The underlying vias/contacts may be copper-based vias or contacts containing aluminum and/or tungsten. The metallization layers under the metallization layer m are preferably copper-based and are formed using commonly used damascene processes with copper.

Each of the metallization layers m through n may include metal lines and interconnect lines. Particularly, interconnect lines are formed in the top metallization layer n. The aluminum-based metal lines can also be used as test pads. As the metallization layers m through n are upper layers, dielectric materials with relatively high-k values can be used as the IMDs to improve the mechanical property of the overall structure, although low-k dielectric materials can also be used.

In the preferred embodiments of the present invention, the top metallization layer n is used to form interconnect lines in addition to its conventional usage for forming bond pads and redistribution lines. The usage of the top metallization layer is thus increased, and one metallization layer may be saved. As a result, the cost and process steps for forming one metallization layer and the underlying via layer are saved. In addition, with one less metallization layer, which is formed in a low-k dielectric material, the mechanical strength of the overall structure is improved. The preferred embodiments of the present invention require no change to existing process steps.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor metal structure comprising:
a substrate;
a copper-based interconnection structure over the substrate, the copper-based interconnection structure comprising a plurality of horizontal metallization layers wherein each of the plurality of horizontal metallization layers comprises copper lines in one of first horizontal dielectric layers;
a first and a second metal line in a same horizontal metallization layer, wherein the first and the second metal lines are formed in the copper-based interconnection structure and physically separated from each other;
at least one aluminum-based horizontal layer over and connected to the copper-based interconnection structure, wherein a top layer of the at least one aluminum-based horizontal layer comprises a bond pad, and an interconnect line directly connected to two underlying vias, wherein each of the two underlying vias is overlying and electrically connected to one of the first and second metal lines in the same horizontal layer;

a second dielectric layer formed over the top layer of the copper-based interconnection structure and vias extending through the second dielectric layer and electrically connecting a top layer of the copper-based interconnection structure and a bottom layer of the at least one aluminum-based layer; and a third dielectric layer overlying the at least one aluminum-based layer and covering the entire length of the interconnect line, wherein the bond pad is exposed through an opening in the third dielectric layer.

2. The semiconductor metal structure of claim 1, wherein the interconnect line is not directly connected to any bond pad in the top layer of the at least one aluminum-based layer.

3. The semiconductor metal structure of claim 1, wherein the second dielectric layer has a thickness of less than about 2 µm.

4. The semiconductor metal structure of claim 1, wherein the at least one aluminum-based layer has a thickness of greater than about 3000 Å.

5. The semiconductor metal structure of claim 1, wherein each of the first dielectric layers and the second dielectric layer have a thickness ratio of less than about 4.

6. The semiconductor metal structure of claim 5, wherein the thickness ratio is less than about 1.5.

7. The semiconductor metal structure of claim 1 further comprising a barrier layer underlying a bottom aluminum-based layer in the at least one aluminum-based layer.

8. The semiconductor metal structure of claim 1, wherein the at least one aluminum-based layer has a thickness less than about 2 µm.

9. The semiconductor metal structure of claim 1, wherein the at least one aluminum-based layer has a thickness between about 3000 Å and about 15000 Å.

10. The semiconductor metal structure of claim 1 further comprising a redistribution line in the top layer of the at least one aluminum-based layer, and continuously connected to the bond pad, wherein the redistribution line is covered by the third dielectric layer.

11. The semiconductor metal structure of claim 1, wherein the third dielectric layer comprises a material selected from the group consisting essentially of silicon nitride, silicon oxynitride, oxide and polyimide.

12. A semiconductor metal structure comprising:
a substrate;
an interconnection structure over the substrate, the interconnection structure comprising a plurality of horizontal metallization layers, wherein each of the plurality of horizontal metallization layers comprises metal lines in one of first dielectric layers that electrically isolate the horizontal metallization layers;
a first and a second metal line in a same horizontal metallization layer, wherein the first and the second metal lines are physically separated from each other;
a second dielectric layer formed over the top layer of the interconnection structure;
a horizontal metal-pad layer over the interconnection structure, wherein the metal-pad layer comprises a bond pad, a redistribution line, and an interconnect line physically separated from the redistribution line and not connected to any bond pad, and wherein the interconnect line is over and electrically connected to the first and the second metal lines;

vias connecting a top layer of the interconnection structure and the metal-pad layer, wherein the vias extend through the second dielectric layer, and wherein a thickness of the second dielectric layer and a total thickness of the first dielectric layers have a thickness ratio of less than about 8; and a passivation layer overlying the metal-pad layer, wherein the bond pad is exposed through an opening in the passivation layer.

13. The semiconductor metal structure of claim 12, wherein the interconnection structure is copper-based.

14. The semiconductor metal structure of claim 12, wherein the metal-pad layer is aluminum-based.

15. The semiconductor metal structure of claim 12, wherein the second dielectric layer has a thickness of less than about 2 µm.

16. The semiconductor metal structure of claim 12, wherein the metal-pad layer has a thickness less than about 2 µm.

17. The semiconductor metal structure of claim 12 further comprising:
a first via immediately underlying, and connected to, a first end of the interconnect line, wherein the first via is electrically connected to the first metal line; and
a second via immediately underlying, and connected to, a second end of the interconnect line, wherein the second end is on an opposite side of the interconnect line than the first end, and wherein the second via is electrically connected to the second metal line.

18. A semiconductor metal structure comprising:
a substrate;
a horizontal metal-pad layer over the substrate, wherein the horizontal metal-pad layer comprises:
a bond pad; and
an interconnect line physically separated from the bond pad;
a dielectric layer underlying the horizontal metal-pad layer;
a first via immediately underlying, and connected to, a first end of the interconnect line and extending through the dielectric layer;
a second via immediately underlying, and connected to, a second end of the interconnect line and extending through the dielectric layer;
a first and a second metal feature underlying the dielectric layer, and connected to the first and the second vias, respectively, wherein the first and the second metal features are physically separated from each other; and
a passivation layer overlying the horizontal metal-pad layer, and covering the entire length of the interconnect line, wherein the bond pad is exposed through an opening in the passivation layer.

19. The semiconductor metal structure of claim 18 further comprising
a redistribution line in the horizontal metal-pad layer and covered by the passivation layer, wherein the redistribution line is continuously connected to the bond pad.

* * * * *